(12) United States Patent
Yano et al.

(10) Patent No.: US 7,235,817 B2
(45) Date of Patent: Jun. 26, 2007

(54) LED LAMP

(75) Inventors: Tadashi Yano, Kyoto (JP); Masanori Shimizu, Kyotanabe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 79 days.

(21) Appl. No.: 10/543,243

(22) PCT Filed: Aug. 3, 2004

(86) PCT No.: PCT/JP2004/011430

§ 371 (c)(1),
(2), (4) Date: Jul. 25, 2005

(87) PCT Pub. No.: WO2005/015646

PCT Pub. Date: Feb. 17, 2005

(65) Prior Publication Data

US 2006/0131594 A1 Jun. 22, 2006

(30) Foreign Application Priority Data

Aug. 7, 2003 (JP) ............................. 2003-288696

(51) Int. Cl.
*H01L 33/00* (2006.01)
(52) U.S. Cl. ................. 257/98; 257/100; 257/E33.061; 257/E33.073; 438/29
(58) Field of Classification Search .................... None
See application file for complete search history.

(56) References Cited

U.S. PATENT DOCUMENTS

| | | | |
|---|---|---|---|
| 3,821,590 A * | 6/1974 | Kosman et al. | ............. 313/499 |
| 3,875,456 A | 4/1975 | Kano et al. | |
| 5,847,507 A | 12/1998 | Butterworth et al. | |
| 5,998,925 A | 12/1999 | Shimizu et al. | |
| 6,417,019 B1 | 7/2002 | Mueller et al. | |
| 6,523,976 B1 * | 2/2003 | Turnbull et al. | ............. 362/231 |
| 6,608,332 B2 * | 8/2003 | Shimizu et al. | ................ 257/98 |
| 6,611,000 B2 * | 8/2003 | Tamura et al. | ................. 257/80 |

(Continued)

FOREIGN PATENT DOCUMENTS

DE          2 260 285          6/1973

(Continued)

OTHER PUBLICATIONS

U.S. Appl. No. 11/209,906, filed Aug. 2005, Takahashi et al.

*Primary Examiner*—Evan Pert
*Assistant Examiner*—Victor A. Mandala, Jr.
(74) *Attorney, Agent, or Firm*—Akin Gump Strauss Hauer & Feld LLP

(57) ABSTRACT

According to the present invention, a substrate 11, a cluster of LED chips, which are arranged two-dimensionally on the substrate 11, and a plurality of phosphor resin portions 13a, 13b that cover the respective LED chips are provided. The phosphor resin portion 13a, 13b includes a phosphor for transforming the emission of its associated LED chip into a light ray having a longer wavelength than that of the emission. A size of the phosphor resin portions 13b, which cover the LED chips located in an outer region of the cluster, is set bigger than that of the other phosphor resin portions 13a, which cover the LED chips located in the remaining non-outer region.

11 Claims, 12 Drawing Sheets

U.S. PATENT DOCUMENTS

| | | | |
|---|---|---|---|
| 6,809,471 B2 * | 10/2004 | Setlur et al. | ............... 313/503 |
| 7,071,493 B2 * | 7/2006 | Owen et al. | ................. 257/88 |
| 2003/0189829 A1 | 10/2003 | Shimizu et al. | |
| 2004/0100192 A1 | 5/2004 | Yano et al. | |
| 2005/0157508 A1 * | 7/2005 | Takeda et al. | ............. 362/459 |

FOREIGN PATENT DOCUMENTS

| | | |
|---|---|---|
| JP | 05-290818 A | 11/1993 |
| JP | 10-065221 B2 | 3/1998 |
| JP | 2000-022220 A | 1/2000 |
| JP | 2000-031547 A | 1/2000 |
| JP | 2001-358370 A | 12/2001 |
| JP | 2002-324313 A | 11/2002 |
| JP | 2003-059332 A | 2/2003 |
| JP | 2003-124528 A | 4/2003 |
| JP | 2004-172586 A | 6/2004 |
| WO | WO 01/82385 A1 | 11/2001 |

* cited by examiner (a)

(b)

(a)

(b)

(a)

(b)

(a)

(b)

(b) 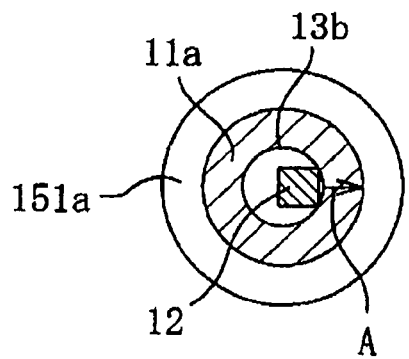

(a)

(b)

ND LAMP

CROSS-REFERENCE TO RELATED APPLICATION

This application is a Section 371 of International Application No. PCT/JP2004/011430, filed Aug. 3, 2004, which was published in the Japanese language on Feb. 17, 2005, under International Publication No. WO 2005/015646 A1, the disclosure of which is incorporated herein by reference.

BACKGROUND OF THE INVENTION

The present invention relates to an LED lamp and more particularly relates to a white LED lamp that can be used as general illumination.

A light emitting diode (LED) is a semiconductor device that can radiate an emission in a bright color with high efficiency even though its size is small. The emission of an LED has an excellent monochromatic peak. To obtain white light from LEDs, a conventional LED lamp arranges red, green and blue LEDs close to each other and gets the light rays in those three different colors diffused and mixed together. An LED lamp of this type, however, easily produces color unevenness because the LED of each color has an excellent monochromatic peak. That is to say, unless the light rays emitted from the respective LEDs are mixed together uniformly, color unevenness will be produced inevitably in the resultant white light. Thus, to overcome such a color unevenness problem, an LED lamp for obtaining white light by combining a blue LED and a yellow phosphor was developed (see Japanese Patent Application Laid-Open Publication No. 10-242513 and Japanese Patent No. 2998696, for example).

According to the technique disclosed in Japanese Patent Application Laid-Open Publication No. 10-242513, white light is obtained by combining together the emission of a blue LED and the yellow emission of a yellow phosphor, which is produced when excited by the emission of the blue LED. That is to say, the white light can be obtained by using just one type of LEDs. Accordingly, the color unevenness problem, which arises when white light is produced by arranging multiple types of LEDs close together, is avoidable.

But the luminous flux of a single LED is too low. Accordingly, to obtain a luminous flux comparable to that of an incandescent lamp, a fluorescent lamp or any other general illumination used extensively today, an LED lamp preferably includes a plurality of LEDs that are arranged as an array. LED lamps of that type are disclosed in Japanese Patent Application Laid-Open Publications No. 2003-59332 and No. 2003-124528. A relevant prior art is also disclosed in Japanese Patent Application No. 2002-324313.

However, an LED lamp, which can overcome the color unevenness problem of the bullet-shaped LED lamp disclosed in Japanese Patent No. 2998696, is disclosed in Japanese Patent Application No. 2002-324313. Hereinafter, this LED lamp that can overcome the color unevenness problem will be described.

The LED lamp with the bullet-shaped appearance as disclosed in Japanese Patent No. 2998696 has a configuration such as that illustrated in FIG. 1. As shown in FIG. 1, the bullet-shaped LED lamp 200 includes an LED chip 121, a bullet-shaped transparent housing 127 to cover the LED chip 121, and leads 122a and 122b to supply current to the LED chip 121. A cup reflector 123 for reflecting the emission of the LED chip 121 in the direction indicated by the arrow D is provided for the mount portion of the lead 122b on which the LED chip 121 is mounted. The LED chip 121 is encapsulated with a first resin portion 124, in which a phosphor 126 is dispersed and which is further encapsulated with a second resin portion. If the LED chip 121 emits a blue light ray, the phosphor 126 is excited by the blue light ray to produce a yellow light ray. As a result, the blue and yellow light rays are mixed together to produce white light.

However, the first resin portion 124 is formed by filling the cup reflector 123 with a resin to encapsulate the LED chip 121 and then curing the resin. For that reason, the first resin portion 124 easily has a rugged upper surface as shown in FIG. 2 on a larger scale. Then, the thickness of the resin including the phosphor 126 loses its uniformity, thus making non-uniform the amounts of the phosphor 126 present along the optical paths E and F of multiple light rays going out of the LED chip 121 through the first resin portion 124. As a result, the unwanted color unevenness is produced.

To overcome such a problem, the LED lamp disclosed in Japanese Patent Application No. 2002-324313 is designed such that the reflective surface of a light reflecting member (i.e., a reflector) is spaced apart from the side surface of a resin portion in which a phosphor is dispersed. FIGS. 3(a) and 3(b) are respectively a side cross-sectional view and a top view illustrating an LED lamp as disclosed in Japanese Patent Application No. 2002-324313. In the LED lamp 300 shown in FIGS. 3(a) and 3(b), an LED chip 112 mounted on a substrate 111 is covered with a resin portion 113 in which a phosphor is dispersed. A reflector 151 with a reflective surface 151a is bonded to the substrate 111 such that the reflective surface 151a of the reflector 151 is spaced apart from the side surface of the resin portion 113.

Since the side surface of the resin portion 113 is spaced apart from the reflective surface 151a of the reflector 151, the shape of the resin portion 113 can be freely designed without being restricted by the shape of the reflective surface 151a of the reflector 151. As a result, the color unevenness can be reduced significantly.

By arranging a plurality of LED lamps having the structure shown in FIG. 3 in matrix, an LED array such as that shown in FIG. 4 is obtained. In the LED lamp 300 shown in FIG. 4, the resin portions 113, each covering its associated LED chip 112, are arranged in columns and rows on the substrate 111, and a reflector 151, having a plurality of reflective surfaces 151a for the respective resin portions 113, is bonded onto the substrate 111.

In such an arrangement, the luminous fluxes of a plurality of LEDs can be combined together. Thus, a luminous flux, comparable to that of an incandescent lamp, a fluorescent lamp or any other general illumination source that is used extensively today, can be obtained easily.

In fabricating the LED lamp 300 shown in FIG. 4, after the LED chips 112 have been mounted in columns and rows on the substrate 111, all of their resin portions 113 are preferably made at a time so as to cover the respective LED chips 112. Ideally, every LED chip 112 should be located at or around the center of the resin portion 113 as shown in FIG. 5. Actually, however, if the manufacturing process has significant tolerance, then not every LED chip 112 will be located at the center of its associated resin portion 113 to cause misalignment. As a result, some LED chips 112 may be exposed on the resin portions 113 as shown in FIG. 6. The LED chips 112 are likely to be exposed as shown in FIG. 6 particularly in the outer region of the matrix.

FIG. 7 illustrates LED chips 112a and 112b, which are located in the outer region and exposed on the resin portions

113. Specifically, the LED chip 112b is located on the outermost region, while the LED chip 112a is located on the second outermost region.

As shown in FIG. 7, there is no resin portion 113 on a part of the LED chip 112b facing the outermost region. Thus, (blue) light ray A emitted from the LED chip 112b is not mixed with the emission of the phosphor but is reflected by the reflector (not shown) to be output as it is (i.e., as a blue ray) in the direction pointed by the arrow G. A light ray (i.e., the blue ray in this case) emitted from an LED chip has directivity and does not mix with other chromatic rays easily. As a result, color unevenness is produced to make the white light emitted from a white LED lamp look as if the white light included blue components. The white LED lamp with such color unevenness is a defective product. Thus, such color unevenness decreases the yield and eventually increases the cost of white LED lamps.

Also, in the arrangement shown in FIG. 7, another blue ray A is radiated from the LED chip 112a, which is located next to the LED chip 112b. However, the light ray A emitted from the LED chip 112a is less noticeable than the light ray A emitted from the outermost LED chip 112b. This is because the light ray A emitted from the LED chip 112a mixes with a light ray B that has passed through the phosphor in the resin portion 113 covering the outermost LED chip 112a (e.g., a light ray containing relatively a lot of yellow components). As a result, the light as pointed by the arrow H looks more like white.

Consequently, in such a white LED lamp in which a plurality of LED chips are arranged, the blue light ray A emitted from the outermost LED chip 112b is a major factor of the color unevenness. In the example illustrated in FIG. 7, the LED chips 112 are fully exposed on their resin portions 113. However, even if those LED chips 112 are not exposed fully but are misaligned from their centers so much as to reduce the outermost thickness of the resin portions 113 significantly, the color unevenness problem is also caused by the blue light ray A.

In order to overcome the problems described above, a primary object of the present invention is to provide an LED lamp that produces light with significantly reduced color unevenness.

BRIEF SUMMARY OF THE INVENTION

An LED lamp according to the present invention includes: a substrate; a cluster of LED chips, which are arranged two-dimensionally on the substrate; and a plurality of phosphor resin portions that cover the respective LED chips. Each phosphor resin portion includes a phosphor for transforming the emission of its associated LED chip into a light ray having a longer wavelength than that of the emission. A size of the phosphor resin portions, which cover the LED chips located in an outer region of the cluster, is set bigger than that of the other phosphor resin portions, which cover the LED chips located in the remaining non-outer region.

In one preferred embodiment, if a reference position is defined with respect to the cluster of LED chips, the size of the phosphor resin portions, covering the LED chips that are located most distant from the reference position, is set bigger than that of the phosphor resin portion covering the LED chip at the reference position.

In another preferred embodiment, each phosphor resin portion has a substantially cylindrical shape with an almost circular cross section when viewed perpendicularly to the substrate, and the diameter of the phosphor resin portions, covering the LED chips located in the outer region, is greater than that of the phosphor resin portions covering the LED chips located in the remaining non-outer region.

In another preferred embodiment, at least one of the LED chips emits a light ray, of which the peak wavelength falls within the visible radiation range of 380 nm to 780 nm, and the phosphor included in the phosphor resin portion that covers the at least one LED chip produces a light ray, of which the peak wavelength also falls within the visible radiation range of 380 nm to 780 nm but is different from the peak wavelength of the LED chip.

In another preferred embodiment, the at least one LED chip of the cluster is a blue LED chip that emits a blue light ray, and the phosphor included in the phosphor resin portion covering the blue LED chip is a yellow phosphor that transforms the blue light ray into a yellow light ray.

In another preferred embodiment, the outer region is a region defined by outermost ones of the LED chips that are arranged two-dimensionally.

In another preferred embodiment, the phosphor resin portions located in the outer region have substantially equal sizes, and the phosphor resin portions located inside of the outer region also have substantially equal sizes.

In another preferred embodiment, each of the LED chips is a bare chip LED, which is flip-chip bonded to the substrate.

In another preferred embodiment, the substrate has a plurality of openings to store the phosphor resin portions that cover the respective LED chips, and each inner side surface of the substrate, defining its associated opening, functions as a reflective surface for reflecting the emission of its associated LED chip.

In another preferred embodiment, the LED lamp further includes a lens that covers each phosphor resin portion.

Another LED lamp according to the present invention includes: a substrate; a cluster of LED chips, which are arranged two-dimensionally on the substrate; and a plurality of phosphor resin portions that cover the respective LED chips. Each phosphor resin portion includes a phosphor for transforming the emission of its associated LED chip into a light ray having a longer wavelength than that of the emission and a resin in which the phosphor is dispersed. The LED lamp further includes means for removing a chromatic ray that has been emitted from some of the two-dimensionally arranged LED chips that are located in an outer region of the cluster.

In one preferred embodiment, the substrate has a plurality of openings to store the phosphor resin portions that cover the respective LED chips, and each inner side surface of the substrate, defining its associated opening, functions as a reflective surface for reflecting the emission of its associated LED chip. The means for removing the chromatic ray is realized by bringing the phosphor resin portions that cover the LED chips in the outer region into contact with the respective reflective surfaces of the openings to store the phosphor resin portions at least in parts of the openings facing an outermost region.

In another preferred embodiment, the phosphor resin portions that cover the LED chips located in the non-outer region are spaced apart from the reflective surfaces of the openings to store the phosphor resin portions.

In another preferred embodiment, the substrate has a plurality of openings to store the phosphor resin portions that cover the respective LED chips, and each inner side surface of the substrate, defining its associated opening, functions as a reflective surface for reflecting the emission of its associated LED chip. The means for removing the chromatic ray is realized by making outermost parts of the reflective surfaces of the openings, in which the phosphor resin portions, covering the LED chips in the outer region, are stored, extend substantially perpendicularly.

In another preferred embodiment, the substrate has a plurality of openings to store the phosphor resin portions that cover the respective LED chips, and each inner side surface of the substrate, defining its associated opening, functions as a reflective surface for reflecting the emission of its associated LED chip. The means for removing the chromatic ray is realized by defining outermost parts of the reflective surfaces of the openings, in which the phosphor resin portions, covering the LED chips in the outer region, are stored, as at least one of a diffusive surface, a low-reflectance surface and a surface with the property of absorbing the chromatic ray.

In another preferred embodiment, the substrate has a plurality of openings to store the phosphor resin portions that cover the respective LED chips, and each inner side surface of the substrate, defining its associated opening, functions as a reflective surface for reflecting the emission of its associated LED chip. The LED lamp further includes lenses, which are provided so as to fill the openings. The means for removing the chromatic ray is realized by defining outermost parts of the lenses in the openings, in which the phosphor resin portions, covering the LED chips in the outer region, are stored, as a diffusive surface.

In another preferred embodiment, the substrate has a plurality of openings to store the phosphor resin portions that cover the respective LED chips, and each inner side surface of the substrate, defining its associated opening, functions as a reflective surface for reflecting the emission of its associated LED chip. The LED lamp further includes lenses, which are provided so as to fill the openings. The means for removing the chromatic ray is realized by making the lenses in the openings, in which the phosphor resin portions, covering the LED chips in the outer region, are stored, have at least one of diffusion property, low transmittance, and the property of absorbing the chromatic ray.

In another preferred embodiment, the substrate has a plurality of openings to store the phosphor resin portions that cover the respective LED chips, and each inner side surface of the substrate, defining its associated opening, functions as a reflective surface for reflecting the emission of its associated LED chip. The LED lamp further includes lenses, which are provided so as to fill the openings. The means for removing the chromatic ray is realized by providing at least one of an opaque layer, a light diffusing layer, a low-transmittance layer, and a chromatic ray absorbing layer on outermost parts of the lenses in the openings, in which the phosphor resin portions, covering the LED chips in the outer region, are stored.

In another preferred embodiment, the outer region is a region defined by outermost ones of the LED chips that are arranged two-dimensionally.

A method for fabricating an LED lamp according to the present invention includes the steps of: arranging a cluster of LED chips on a substrate; and providing a plurality of phosphor resin portions such that the LED chips are covered with the phosphor resin portions. Each phosphor resin portion includes a phosphor that transforms the emission of its associated LED chip into a light ray having a longer wavelength than the emission. The step of providing the phosphor resin portions includes the step of setting, if a reference position is defined with respect to the cluster of LED chips, the size of the phosphor resin portions, covering the LED chips that are located most distant from the reference position, bigger than that of the phosphor resin portion covering the LED chip at the reference position.

DETAILED DESCRIPTION OF THE INVENTION

Figure 28:
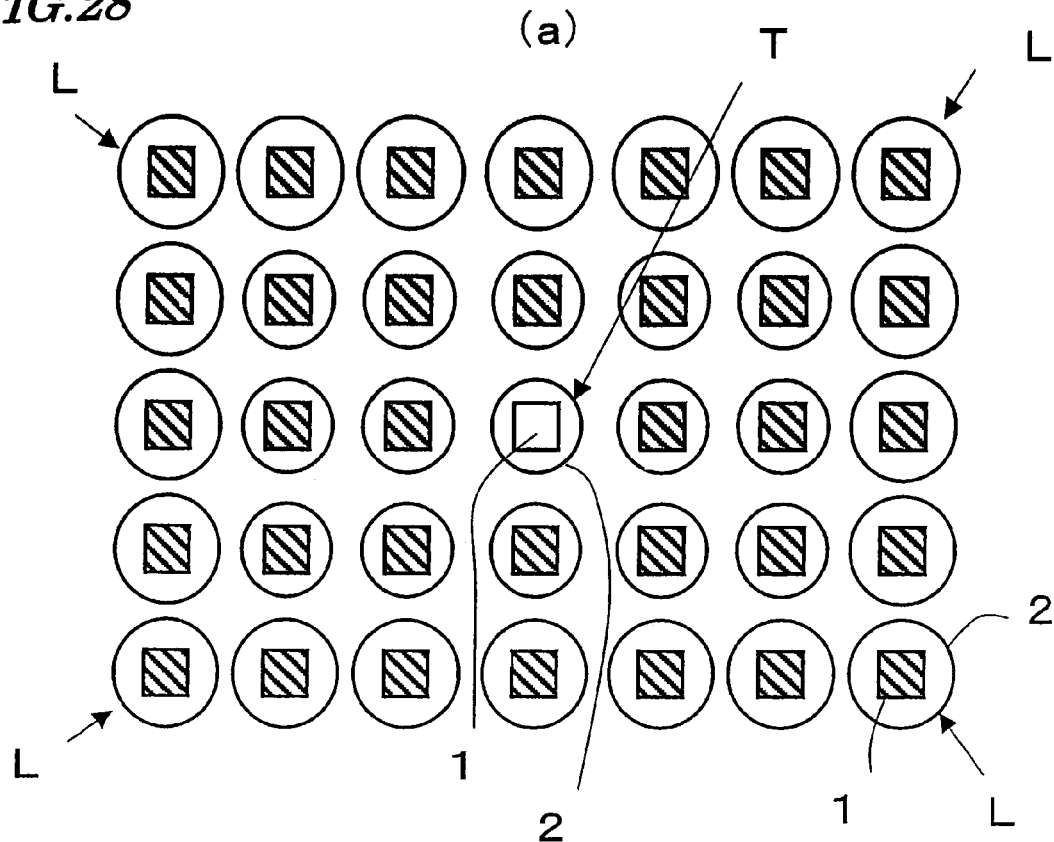
FIGS. 28(a) to 28(c) show layouts (exemplary arrangements) of a cluster of LED chips in an LED lamp according to the present invention.
Figure 28:
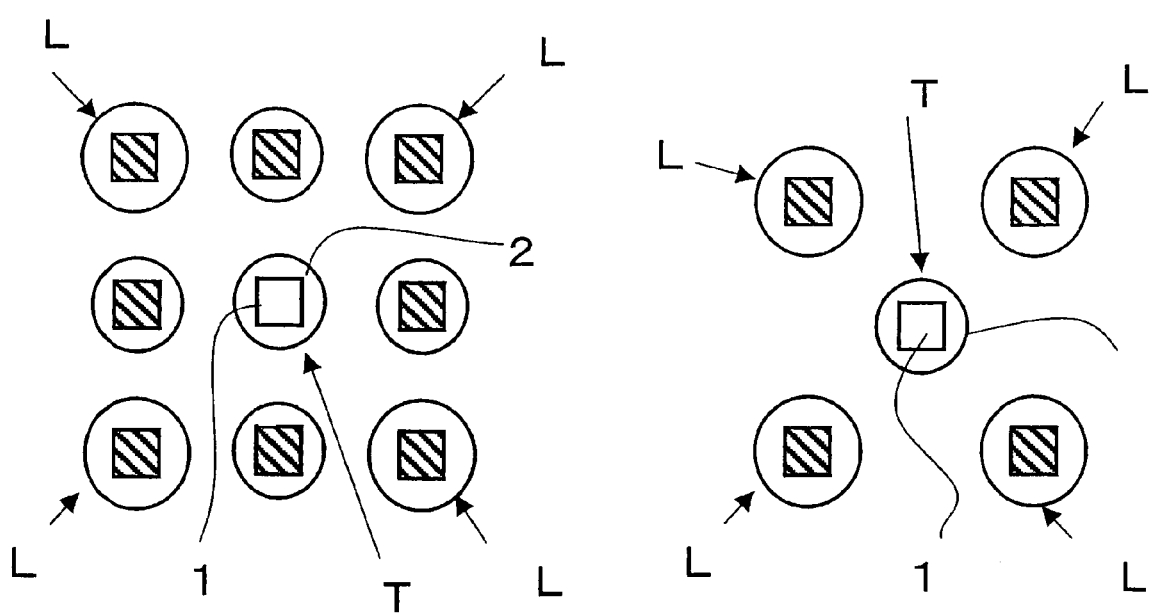
Figure 29:
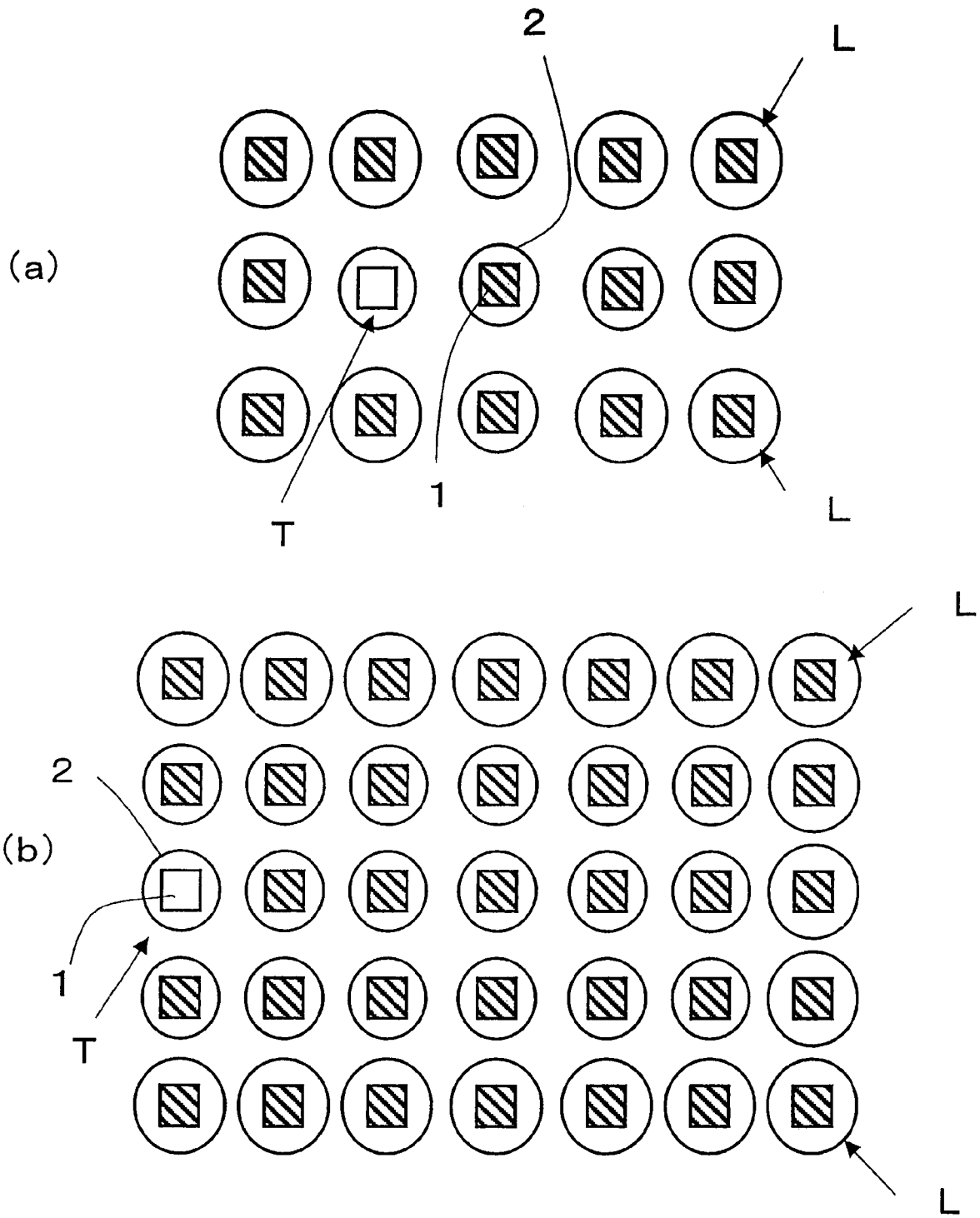
FIGS. 29(a) and 29(b) show other layouts (exemplary arrangements) of a cluster of LED chips in an LED lamp according to the present invention.
Figure 30:
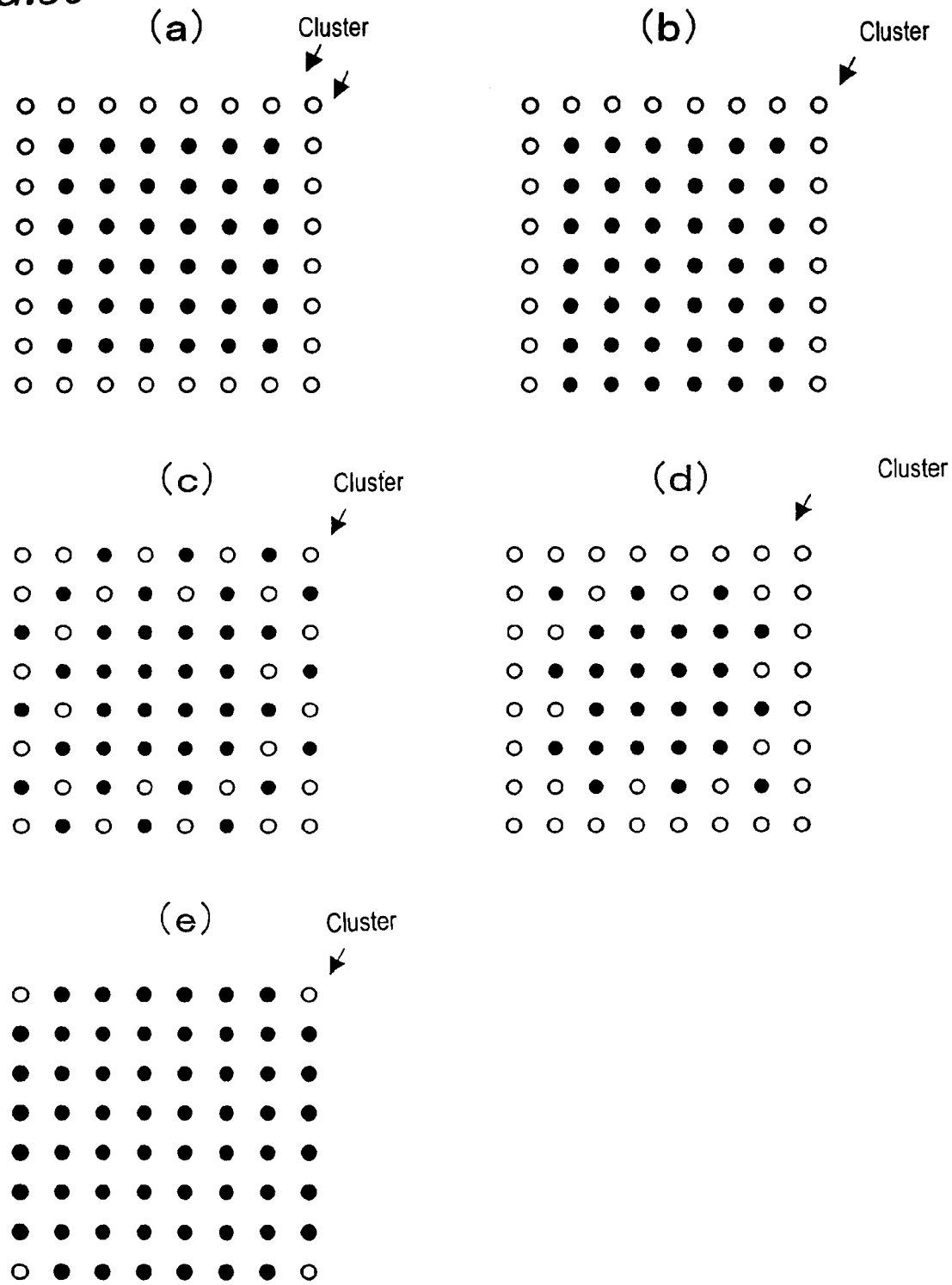
FIGS. 30(a) through 30(e) show alternative layouts (exemplary arrangements) of a cluster of LED chips in an LED lamp according to the present invention.

First of all, the principal features of an LED lamp according to the present invention will be described with reference to FIGS. 28 through 30.

Referring to FIG. 28(a), illustrated is an exemplary layout (or arrangement) of a cluster of LED chips 1 that are arranged on the substrate of an LED lamp according to the present invention.

As shown in FIG. 28(a), the LED lamp of the present invention includes a plurality of LED chips 1, which are arranged two-dimensionally on the substrate, and phosphor resin portions 2, which cover their associated LED chips 1. Each of the phosphor resin portions 2 includes a phosphor for transforming the emission of its associated LED chip 1 into a light ray having a longer wavelength than that of the emission.

The prominent feature of the present invention is that the size of the phosphor resin portions, which cover the LED chips 1 located in an outer region of the cluster, is set bigger than that of the other phosphor resin portions, which cover the LED chips located in the remaining non-outer region (i.e., the inner region) of the cluster.

Looked at from a different viewpoint, the present invention is characterized in that if a reference position T is defined with respect to the cluster of LED chips 1, the size of the phosphor resin portions 2, covering the LED chips 1 that are located at most distant positions L from the reference position T, is set bigger than that of the phosphor resin portion 2 covering the LED chip 1 located at the reference position T. In FIG. 28(a), the rectangular portion representing the LED chip 1 located at the reference position T is not hatched.

As will be described more fully later, after the two-dimensional cluster of LED chips 1 has been formed on the substrate, the phosphor resin portions 2 are provided so as to cover their associated LED chips 1 preferably by a printing technique, for example. In that case, the printing block needs to be positioned with respect to the cluster of LED chips 1 on the substrate. The reference point for that positioning is preferably defined at or around the center of the substrate. As a result, the center of the LED chip 1 located near the reference position matches highly accurately that of the phosphor resin portion 2 that covers the LED chip 1. However, misalignment may occur between the center of any other LED chip 1 and that of the phosphor resin portion 2 that covers the LED chip 1.

This misalignment usually tends to be the maximum at the LED chips 1 that are located most distant from the reference position T. Thus, in a preferred embodiment of the present invention, the size of the phosphor resin portions 2 at the positions L is set bigger than that of the phosphor resin portion 2 at the reference position T such that the misaligned LED chips 1 would not be exposed on the phosphor resin portions 2 even in cases of such misalignment.

FIGS. 28(b) and 28(c) illustrate two exemplary arrangements of LED chips 1 in an LED lamp in which the phosphor resin portions 2 located at the most distant positions L with respect to the reference position T have an increased size. In the example illustrated in FIG. 28(b), the LED chips 1, which are located at the four corners of a cluster of nine (=3×3) LED chips, are covered with a bigger phosphor resin portion 2 than that located at the reference position T (i.e., at the center).

FIGS. 29(a) and 29(b) illustrate examples in which the reference position T has been shifted from the center of the cluster. Even in such situations, the size of the phosphor resin portions 2 located at the most distant positions L with respect to the reference position T is also set bigger than that of the phosphor resin portion 2 located at the reference position T. In that case, the size of the remaining phosphor resin portions 2, located at respective positions other than the most distant positions L with respect to the reference position T, may also be set bigger than that of the phosphor resin portion 2 located at the reference position T.

The chromatic color produced by that misalignment is most visually noticeable in a situation where the misalignment has occurred in the outer region of the cluster of LED chips (as will be described in further detail later). For that reason, in a preferred embodiment of an LED lamp according to the present invention, the size of the phosphor resin portions that cover the LED chips located in an outer region of the two-dimensional cluster (which will be sometimes referred to herein as an "outer region" simply) is set bigger than that of the other phosphor resin portions that cover the LED chips located in the remaining non-outer region. Then, the emission of chromatic rays from the respective LED chips located in the outer region can be minimized. As a result, the color unevenness can be eliminated effectively.

FIGS. 30(a) through 30(e) illustrate exemplary arrangements of 64 (=8×8) LED chips according to a preferred embodiment of the present invention. In FIGS. 30(a) through 30(e), the solid circles represent phosphor resin portions of the smaller size, while the open circles represent phosphor resin portions of the bigger size. In these examples, the reference position is not an issue. Accordingly, even if the arrangement of phosphor resin portions is determined by a method in which the position of a particular LED chip is not considered a reference, the arrangements illustrated in these drawings may also be adopted.

In the example illustrated in FIG. 30(a), all of the LED chips located in the outermost region of the LED chip cluster are covered with the bigger phosphor resin portions. On the other hand, in the examples illustrated in FIGS. 30(b), 30(c) and 30(e), some of the LED chips located in the outermost region of the cluster are covered with the smaller phosphor resin portions.

And in the example illustrated in FIG. 30(d), not just the LED chips located in the outermost region of the LED chip cluster but also some of the LED chips located inside of them are covered with the bigger phosphor resin portions.

In this manner, by setting the size of the phosphor resin portions in the outer region of the cluster (which could be easily affected by the color unevenness) bigger than that of the phosphor resin portions in the inner region, the effects of the present invention are achieved sufficiently.

Hereinafter, preferred embodiments of the present invention will be described with reference to the accompanying drawings, in which a number of like components with substantially the same function are identified by the same reference numeral for the sake of simplicity. It should be noted, however, that the present invention is in no way limited to the following specific preferred embodiments.

Embodiment 1

Hereinafter, an LED lamp according to a first preferred embodiment of the present invention will be described with reference to FIGS. 8 and 9.

Figure 8:
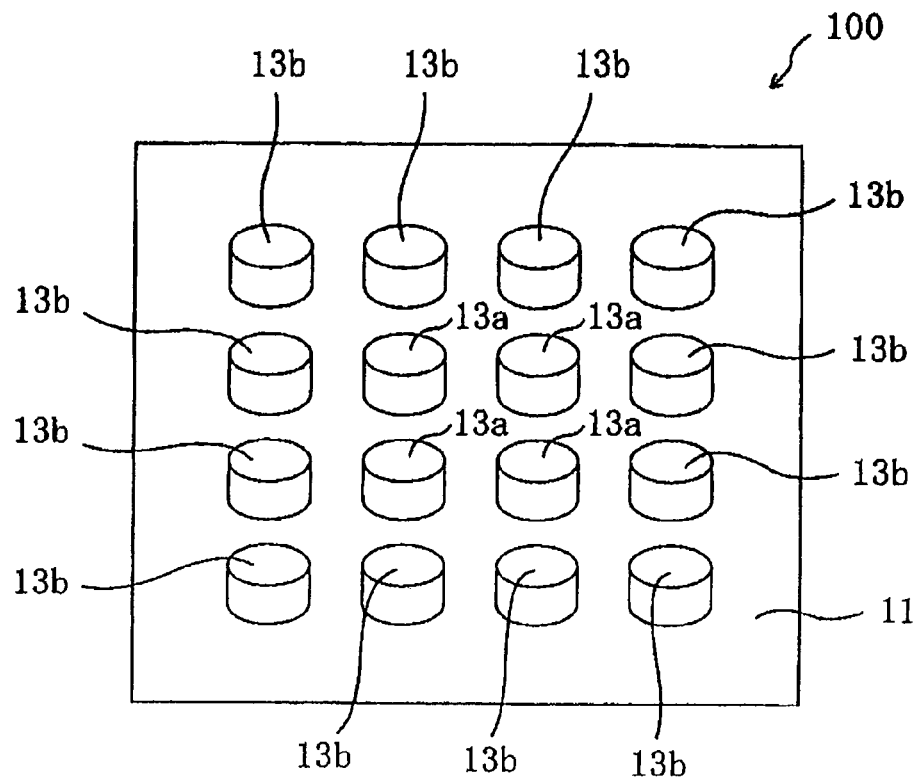
FIG. 8 is a perspective view schematically illustrating an arrangement for an LED lamp 100 according to a first preferred embodiment of the present invention.

FIG. 8 schematically illustrates an arrangement for an LED lamp 100 according to this preferred embodiment. FIG. 9(a) is a cross-sectional view of an LED chip, which is located in the non-outer region of an LED chip cluster, as viewed on a plane parallel to the principal surface of a substrate. On the other hand, FIG. 9(b) is a cross-sectional view of another LED chip, which is located in the outer region of the cluster, as also viewed on a plane parallel to the principal surface.

The LED lamp 100 includes a substrate 11, a cluster of LED chips 12 that are arranged two-dimensionally on the substrate 11, and phosphor resin portions 13 (13a and 13b) that cover their associated LED chips 12. Each of these phosphor resin portions 13 includes a phosphor (or luminophor) for transforming the emission of its associated LED chip 12 into a light ray having a longer wavelength than the emission and a resin in which the phosphor is dispersed.

The LED chip 12 produces light having a peak wavelength falling within the visible range of 380 nm to 780 nm. The phosphor dispersed in the phosphor resin portion 13 produces an emission that has a different peak wavelength from that of the LED chip 12 within the visible range of 380 nm to 780 nm. For example, the LED chip 12 may emit a blue light ray and the phosphor included in the phosphor resin portion 13 may be a yellow phosphor that transforms the blue ray into a yellow ray. In that case, the blue and yellow rays are mixed together to produce white light.

Specifically, the LED chip 12 may be made of a gallium nitride (GaN) based material and may emit light with a wavelength of 460 nm, for example. When such a blue-ray-emitting LED chip is used, $(Y.Sm)_3$, $(Al.Ga)_5O_{12}:Ce$ or $(Y_{0.39}Gd_{0.57}Ce_{0.03}Sm_{0.01})_3Al_5O_{12}$ may be used effectively as the phosphor.

In the cluster of LED chips 12 that are arranged two-dimensionally on the substrate 11, the size of the phosphor resin portions 13b that cover the LED chips 12 located in the outer region of the cluster is set bigger than that of the phosphor resin portions 13 that cover the LED chips 12 located in the remaining non-outer region (i.e., the inner region) of the cluster. As used herein, the "size of each phosphor resin portion 13" is measured as the phosphor resin portion 13 is viewed from right over the substrate 11 (i.e., along a normal to the substrate 11). More specifically, the "size of the phosphor resin portion 13" refers to the cross-sectional area of the phosphor resin portion 13 as taken along a plane, which is perpendicular to the normal to the substrate 11 and on which its associated LED chip 12 is present. And examples of such cross sections are shown in FIGS. 9(a) and 9(b).

In this preferred embodiment, the phosphor resin portions 13 have a substantially cylindrical shape. Thus, when viewed from over the substrate 11, the phosphor resin portions 13 have a substantially circular upper surface as shown in FIGS. 9(a) and 9(b). The phosphor resin portions 13 illustrated in FIGS. 9(a) and 9(b) have deviated from their intended positions (i.e., the positions at which their associated LED chips 12 are centered). In at least some (or even all) of the phosphor resin portions 13 shown in FIG. 8, the LED chip 12 may be located at the center of its associated phosphor resin portion 13. In this preferred embodiment, the phosphor resin portions 13 have a substantially cylindrical shape. Alternatively, the phosphor resin portions may also have a quadrangular prism shape or any other polygonal prism shape.

As shown in FIGS. 9(a) and 9(b), the diameter of the phosphor resin portion 13b located in the outer region of the LED chip cluster is greater than that of the phosphor resin portion 13a located in the inner (or center) region of the LED chip cluster. As can be seen from FIG. 9(b), by increasing the size (i.e., the diameter) of the phosphor resin portion 13b in the outer region, even if misalignment has occurred during the process step of making the phosphor resin portions 13, it is still possible to prevent the LED chip 12 from being exposed either partially or entirely on the resin portion 13b.

On the other hand, the phosphor resin portion 13a in the inner region shown in FIG. 9(a) is big enough to prevent its associated LED chip 12 from being exposed on the phosphor resin portion 13a unless some misalignment has occurred between the LED chip 12 and the phosphor resin portion 13a. FIG. 9(a) illustrates a situation where that misalignment has occurred to expose part of the LED chip 12 on the phosphor resin portion 13a.

Figure 7:
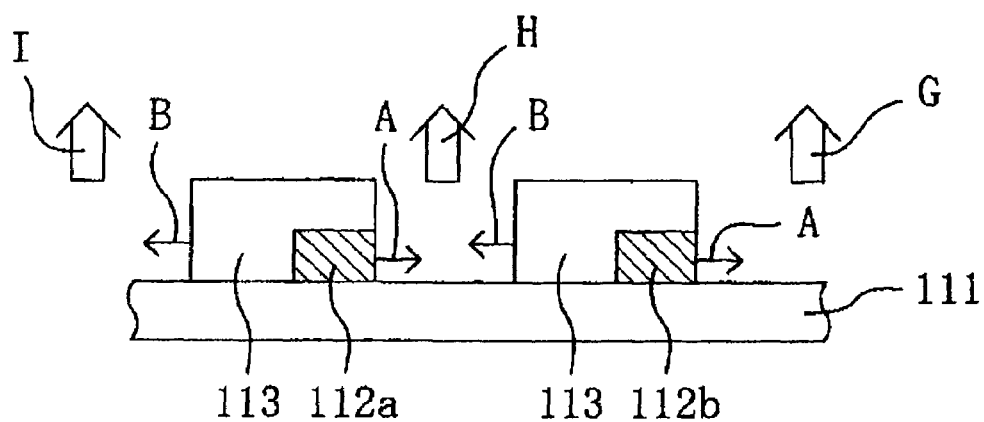
FIG. 7 is a cross-sectional view illustrating a mechanism to produce color unevenness.

A blue ray is emitted from the LED chip 12 in the state shown in FIG. 9(a). This ray corresponds to the light ray A emitted from the LED chip 112a shown in FIG. 7. The light ray A is mixed with another light ray (i.e., the light ray B shown in FIG. 7 in this case), thereby outputting (white) light as pointed by the arrow H. For that reason, the color unevenness due to the smaller (more exactly, the standard) size of the phosphor resin portions 13b in the inner region does not pose a serious problem.

In this preferred embodiment, the cross-sectional area of the phosphor resin portion 13b (i.e., the area of the circle shown in FIG. 9(a)) is defined at least about 5% (e.g., 5% to 30%, preferably 14%) bigger than that of the phosphor resin portion 13a (i.e., the area of the circle shown in FIG. 9(a)). Comparing their diameters, the diameter of the phosphor resin portion 13b is defined at least about 5% (e.g., 5% to 30%, preferably 7% at a tolerance of 2%) greater than that of the phosphor resin portion 13b.

In the example illustrated in FIGS. 9(a) and 9(b), if the LED chip 12 has approximately 0.3 mm×0.3 mm dimensions, then the phosphor resin portion 13a may have a diameter of about 0.75 mm, while the phosphor resin portion 13b may have a diameter of about 0.8 mm. It should be noted that these numerical values are just examples. Thus, the areas or diameters of the phosphor resin portions 13a and 13*b* may be appropriately defined according to the error (e.g., tolerance) allowed in the process step of making the phosphor resin portions.

Figure 9:
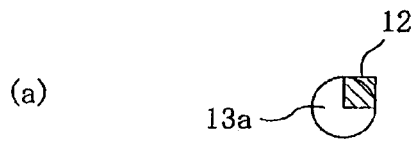
FIGS. 9(a) and 9(b) are cross-sectional views of an LED chip 12 located in the inner region and an LED chip 12 located in the outer region, respectively, as viewed from over themselves.

Although it is contrary to the principle of this preferred embodiment, it is not impossible to adopt an arrangement in which every phosphor resin portion 13 has an increased size as shown in FIG. 9(*b*), no matter whether the resin portion 13 is located in the inner region or in the outer region. In that case, however, every combination of the LED chip 12 and the phosphor resin portion 13 would be imbalanced and the luminous flux of the LED lamp might decrease. That is why in this preferred embodiment, the size of the phosphor resin portions 13*b* in the outer region (in the outermost region, in particular) is selectively increased in order to keep the luminous flux of the LED lamp 100 sufficiently high and yet minimize the color unevenness.

Figure 1:
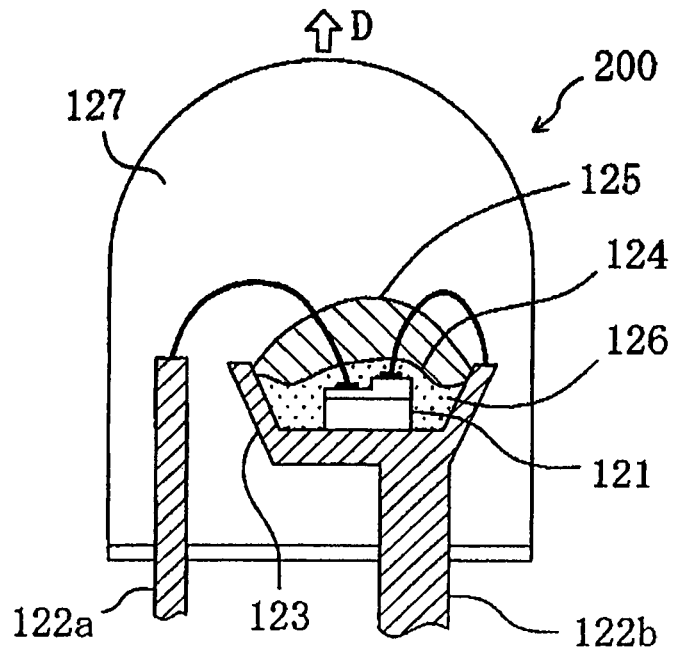
FIG. 1 is a cross-sectional view schematically illustrating the configuration of a bullet-shaped LED lamp as disclosed in Japanese Patent No. 2998696.
Figure 2:
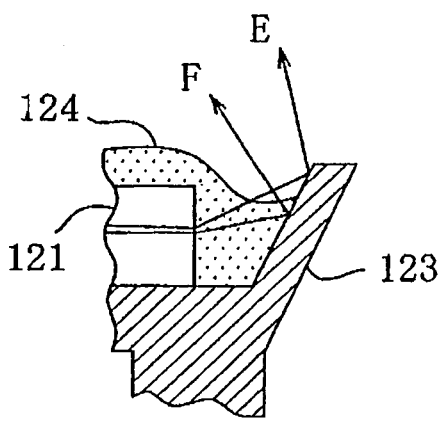
FIG. 2 illustrates the main portion of the bullet-shaped LED lamp shown in FIG. 1 on a larger scale.
Figure 3:
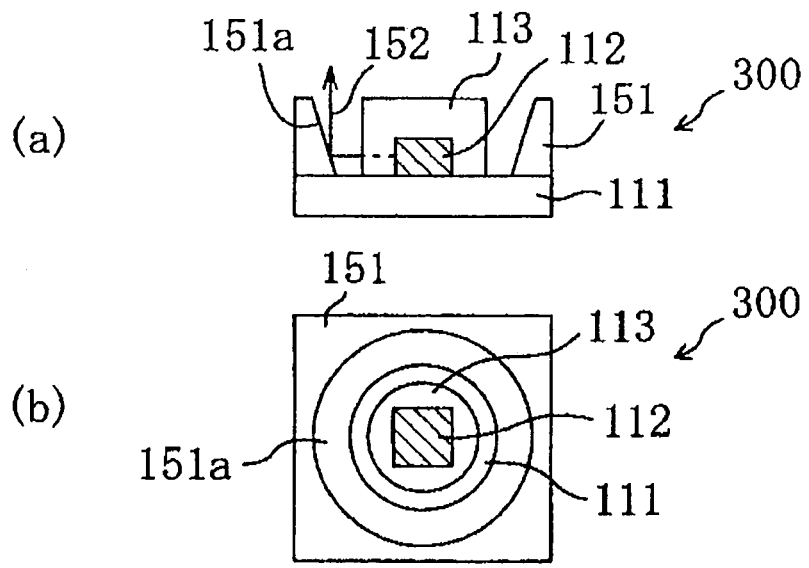
FIGS. 3(a) and 3(b) are respectively a side cross-sectional view and a top view illustrating an LED lamp as disclosed in Japanese Patent Application No. 2002-324313.
Figure 4:
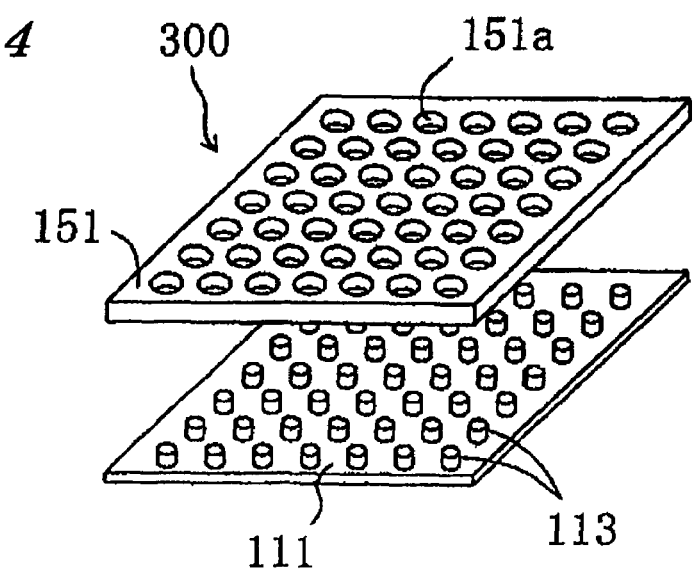
FIG. 4 is a perspective view illustrating an exemplary configuration in which a number of LED lamps with the configuration shown in FIG. 3 are arranged in matrix.
Figure 5:
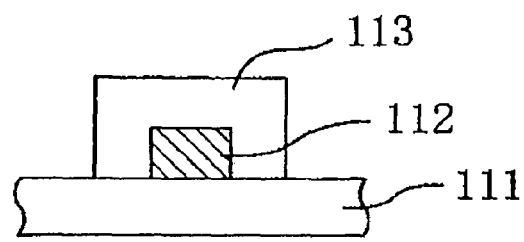
FIG. 5 is a cross-sectional view showing a positional relationship between an LED chip 112 and a resin portion 113.
Figure 6:
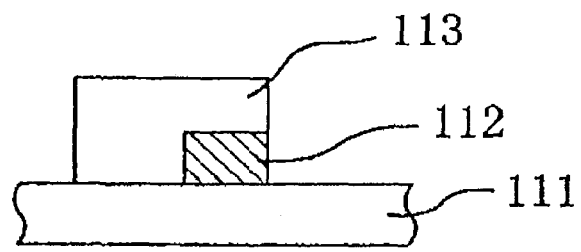
FIG. 6 is a cross-sectional view showing a positional relationship between another LED chip 112 and another resin portion 113.

In the arrangement shown in FIG. 8, the phosphor resin portions 13 covering the LED chips 12 are arranged as a 4×4 matrix on the substrate 11. However, the number is not particularly limited as long as the arrangement is at least a 3×3 matrix. For example, the arrangement may be a 5×5 matrix, a 6×6 matrix as shown in FIG. 4 or even a 7×7 or 8×8 matrix, too.

Furthermore, the two-dimensional arrangement of the phosphor resin portions 13 is not limited to the matrix arrangement such as that shown in FIG. 8, either, but may also be a substantially concentric arrangement, a spiral arrangement or any other suitable arrangement. In any of those alternative arrangements, by setting the diameter of the phosphor resin portions 13 (13*b*) located in the outer region greater than that of the phosphor resin portions 13 (13*a*) located in the inner region, the color unevenness, which may be caused by some misalignment during the process step of making the phosphor resin portions 13, can be minimized or even eliminated.

In this case, if the LED chips 12 do not have to be arranged in matrix, then the surrounding region may be defined by at least four chips (i.e., one chip located at the center and the other three chips surrounding it). Meanwhile, if the LED chips 12 have to be arranged in matrix, then the surrounding region may be defined by at least 3×3 matrix as described above. Suppose LED chips are further developed so dramatically as to make just a single LED chip 12 provide a huge luminous flux. In that case, even a white LED lamp made up of only four or nine LED chips may realize a luminous flux that is high enough to make the lamp effectively usable as general illumination. When that day comes, the technology of this preferred embodiment may be effectively applicable to even a white LED lamp including such a small number of LED chips 12.

Figure 10:
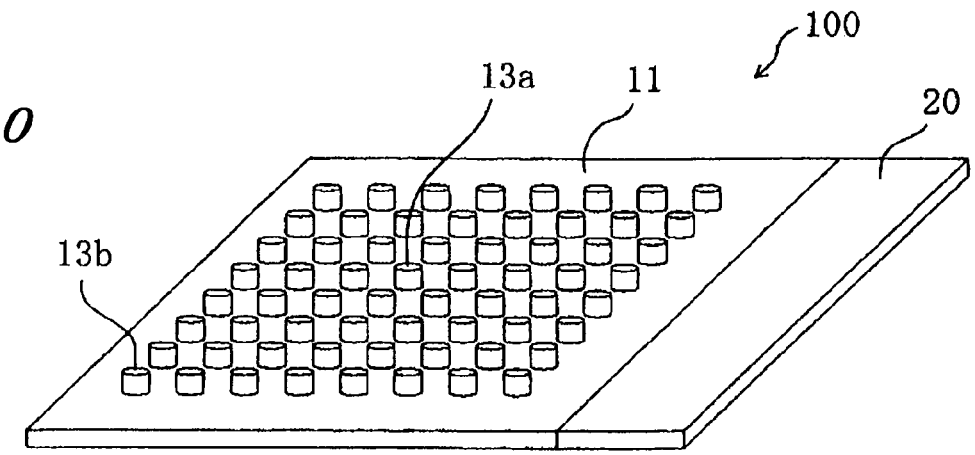
FIG. 10 is a perspective view schematically illustrating a configuration for a card LED lamp 100 according to the first preferred embodiment of the present invention.

FIG. 10 illustrates an LED lamp 100 in which 8×8 phosphor resin portions 13 are arranged in matrix on the substrate 11. In the LED lamp 100 shown in FIG. 10, to minimize the color unevenness that could be caused by chromatic rays (i.e., blue rays) emitted from the surrounding region, the phosphor resin portions 13*b* located in the outer region (i.e., the outermost region) have the bigger size as shown in FIG. 9(*b*) while the phosphor resin portions 13*a* located elsewhere (i.e., in the inner region) have the smaller size (more exactly, the standard size) as shown in FIG. 9(*a*).

In the arrangement shown in FIG. 10, to minimize the color unevenness that could be caused by the blue rays emitted from the outer phosphor resin portions 13 located inside of the outermost region (e.g., in the next outermost region), those phosphor resin portions 13 located inside of the outermost region may also be the phosphor resin portions 13*b* shown in FIG. 9(*b*). However, if all of the phosphor resin portions 13 had their sizes increased, then the luminous flux would decrease as described above. In addition, if the amount of unnecessary phosphor were increased, then the cost would rise, too.

If the phosphor resin portions 13*b* located in the outer region have substantially equal sizes and if the phosphor resin portions 13*a* located in the inner region also have substantially equal sizes, then the phosphor resin portions 13 to be made have just two different sizes, which is advantageous considering the simplicity of the manufacturing process. However, the closer to the outermost region the LED chips 12 are, the more serious the effects of the color unevenness generated would be. That is why phosphor resin portions 13 of multiple different sizes may be designed and arranged such that the phosphor resin portions 13 increase their sizes toward the outermost region. That is to say, phosphor resin portions 13 of just two different sizes may be arranged. Or phosphor resin portions 13 of gradually changing sizes may be arranged with the degree of seriousness of the color unevenness taken into account.

If the phosphor resin portions 13 are formed by the screen process printing technique to be described later, then phosphor resin portions 13 of arbitrary sizes may be provided on the substrate surface just by changing the diameters of holes of the printing block from one position to another. Thus, the sizes of the phosphor resin portions 13 can be changed gradually without increasing the number of manufacturing process steps.

FIG. 10 illustrates a card LED lamp 100. In this card LED lamp 100, the substrate 11 includes a feeder section 20, which is electrically connected to the LED chips in the phosphor resin portions 13 by way of interconnects embedded in the substrate 11. The detailed configuration of the feeder section 20 is not shown in FIG. 10. Optionally, a feeder terminal may be provided on the surface of the feeder section 10.

When the card LED lamp 100 shown in FIG. 10 is actually used, a metallic reflector with multiple openings to accommodate the phosphor resin portions 13 covering the respective LED chips 12 (see the reflector 151 shown in FIG. 4) is preferably put on the substrate 11 in order to define the direction of the illumination light and increase the luminous flux.

It should be noted that the substrate 11 and the reflector (151) may be collectively called the "substrate" of the LED lamp 100 (i.e., the "substrate" may include the reflector). Alternatively, if the surface of the substrate 11 is turned into a reflective surface (151*a* in FIG. 12), then the substrate 11 itself may be used as an optical reflective member.

Figure 11:
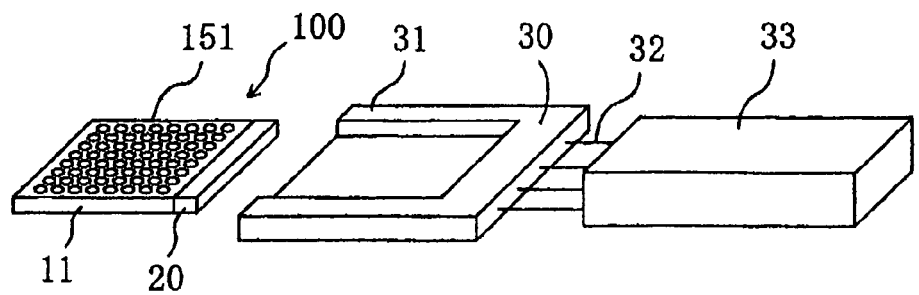
FIG. 11 is a perspective view illustrating how the card LED lamp 100 may be used.

This card LED lamp 100 may be used as shown in FIG. 11. FIG. 11 shows the LED lamp 100 obtained by bonding the reflector 151 to the substrate 11, a connector 30 to/from which the LED lamp 100 is attachable and removable freely, and a lighting circuit 33 to be electrically connected to the LED lamp 100 by way of the connector 30. The LED lamp 100 is inserted into the connector 30 that has a pair of guide grooves 31. The connector 30 includes a feeder electrode (not shown) to be electrically connected to the feeder electrode (not shown, either) that is provided on the feeder section 10 of the LED lamp 100. The feeder electrode of the connector 30 is electrically connected to the lighting circuit by way of lines 32.

Figure 12:
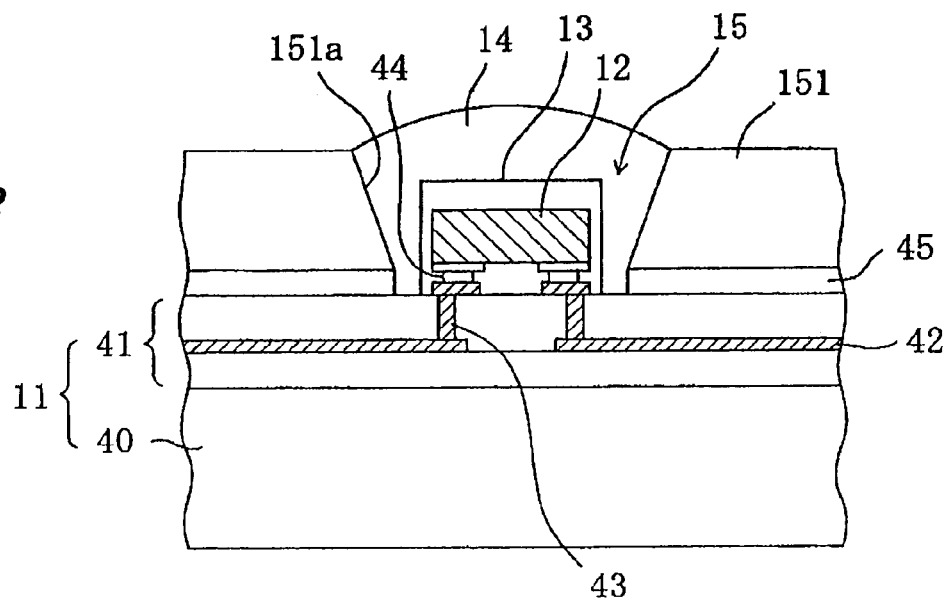
FIG. 12 is a cross-sectional view illustrating an LED chip 12 and its surrounding portions in an LED lamp 100 with a reflector 151.

FIG. 12 is a cross-sectional view illustrating a portion of the LED lamp 100 with the reflector 151, surrounding the LED chip 12, on a larger scale. In FIG. 12, the LED chip 12 is flip-chip bonded to an interconnection pattern 42 of a multilayer wiring board 41, which is attached to the metal plate 40. In this case, the substrate 11 is made up of the metal plate 40 and the multilayer wiring board 41. The LED chip 12 is an LED bare chip, which is covered with the phosphor resin portion 13. And the phosphor resin portion 13 is further covered with a lens 14, which may be made of a resin, for example.

In this preferred embodiment, the multilayer wiring board 41 includes a two-layered interconnection pattern 42, in which interconnects belonging to the two different layers are connected together by way of via metals 43. Specifically, the interconnects 42 belonging to the upper layer are connected to the electrodes of the LED chip 12 via Au bumps 44. In the example illustrated in FIG. 12, an adhesive sheet (stress relaxing layer) 45 is provided between the reflector 151 and the multilayer wiring board 41. This adhesive sheet 45 can not only relax the stress, resulting from the difference in thermal expansion coefficient between the metallic reflector 151 and the multilayer wiring board 42, but also ensure electrical insulation between the reflector 151 and the upper-level interconnects of the multilayer wiring board 41.

The reflector 151 has an opening 15 to accommodate the phosphor resin portion 13 that covers the LED chip 12. The side surface defining the opening 15 is used as a reflective surface 151a for reflecting the light that has been emitted from the LED chip 12. In this case, the reflective surface 151a is spaced apart from the side surface of the phosphor resin portion 13 such that the shape of the phosphor resin portion 13 is not affected by the reflective surface 151a so much as to produce color unevenness.

The specifics and effects of this spacing arrangement are disclosed in detail in the description and drawings of European Patent Publication EP 1 418 630 A1 and U.S. patent application Ser. No. 10/704,005, which was filed with the United States Patent and Trademark Office on Nov. 7, 2003. The entire contents of European Patent Publication EP 1 418 630 A1 and U.S. patent application Ser. No. 10/704,005 are hereby incorporated by reference.

In this preferred embodiment, the reflector 151a is designed such that not just the side surface of the phosphor resin portions 13a but also that of the phosphor resin portions 13b with the greater diameter are spaced apart from the reflector 151a in order to minimize the color unevenness.

FIGS. 8 and 10 show substantially cylindrical phosphor resin portions 13. As used herein, the "substantially cylindrical" shape may refer to not only a completely circular cross section but also a polygonal cross section with at least six vertices. This is because a polygon with at least six vertices substantially has axial symmetry and can be virtually identified with a "circle".

By using a phosphor resin portion 13 with such a substantially cylindrical shape, even if the LED chip 12 being ultrasonic flip-chip bonded to the substrate rotated due to the ultrasonic vibrations applied thereto, the luminous intensity distribution of the LED chip would not be affected so easily as compared with a phosphor resin portion with a triangular or square cross section.

In the preferred embodiment described above, the white LED lamp 100, including a plurality of LEDs each made up of a blue LED chip 12 and a yellow phosphor, has been described. However, a white LED lamp, which produces white light by combining an ultraviolet LED chip, emitting an ultraviolet ray, with a phosphor that produces red (R), green (G) and blue (B) rays when excited with the ultraviolet ray, was also developed recently.

When used, the ultraviolet LED chip emits an ultraviolet ray with a peak wavelength of 380 nm to 400 nm. Thus, even though the light ray may be called an "ultraviolet ray", chromatic rays may still be emitted. Accordingly, the arrangement of this preferred embodiment, including the phosphor resin portions 13a and 13b, can also be used effectively even in an LED lamp using such ultraviolet LED chips.

The phosphor, producing red (R), green (G) and blue (B) rays, has peak wavelengths of 450 nm, 540 nm and 610 nm within the visible range of 380 nm to 780 nm.

Hereinafter, a method of forming the multiple phosphor resin portions 13 in the same process step (i.e., "simultaneously" so to speak) will be described with reference to FIGS. 13 through 17. Various methods may be used to form the phosphor resin portions 13 simultaneously. Examples of those methods include a screen process printing method, an intaglio printing method, a transfer method and a dispenser method.

Figure 13:
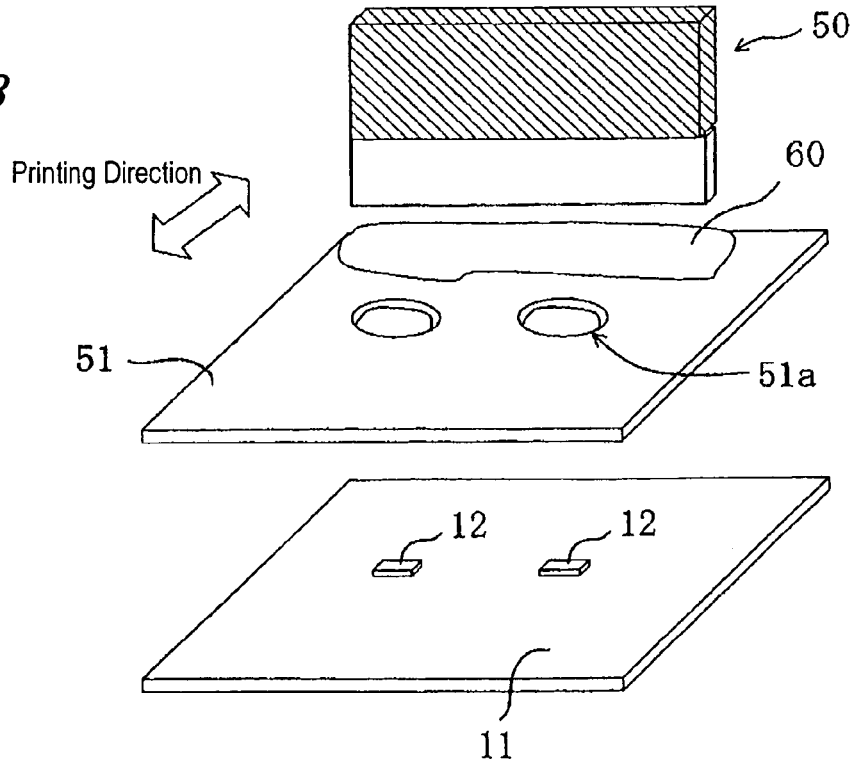
FIG. 13 is a perspective view showing the process step of forming multiple phosphor resin portions 13 by a screen process printing technique.

FIG. 13 shows the process step of forming the phosphor resin portions 13 by the screen process printing technique.

First, a substrate 11 on which multiple LED chips 12 are arranged is prepared. FIG. 13 shows only two LED chips 12 to make this method easily understandable. Actually, however, a substrate 11 on which a far greater number of LED chips 12 are arranged two-dimensionally (e.g., in matrix, substantially concentrically or spirally) should be prepared to fabricate the LED lamp 100 of this preferred embodiment.

Next, a printing plate 51, having a plurality of openings (or through holes) 51a in the same size as that of the phosphor resin portions 13 (13a and 13b) to be obtained, is placed over the substrate 11 such that the LED chips 12 are located within the openings 51a. Then, the printing plate 51 and the substrate 11 are brought into close contact with each other.

Thereafter, a squeeze 50 is moved in a printing direction, thereby filling the openings 51a with a resin paste 60 on the printing plate 51 and covering the LED chips 12 with the resin paste 60. When the printing process is finished, the printing plate 51 is removed. The phosphor is dispersed in the resin paste 60. Accordingly, when the resin paste 60 is cured, the phosphor resin portions 13 can be obtained.

If the size of the outer phosphor resin portions 13 should be different from that of the inner phosphor resin portions 13, then the size of the openings 51a in the outer region may be different that of the openings 51a in the inner region. As for the other methods to be described below, the same process step as this process step of the screen process printing method will not be described again but the description will be focused on only their unique process steps.

Figure 14:
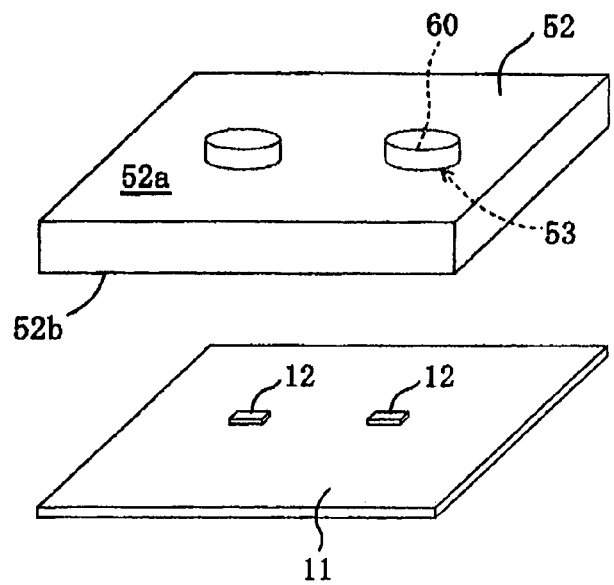
FIG. 14 is a perspective view showing the process step of forming multiple phosphor resin portions 13 by an intaglio printing technique.
Figure 15:
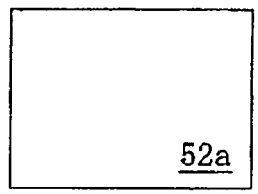
FIGS. 15(a) and 15(b) are plan views showing the upper and lower surfaces 52a and 52b of the printing block 52 for use in the intaglio printing process.
Figure 15:
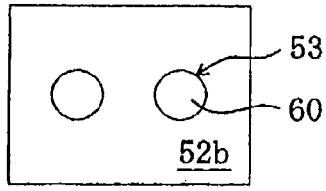

FIG. 14 shows the process step of forming the phosphor resin portions 13 by the intaglio printing method. FIGS. 15(a) and 15(b) respectively show the upper surface 52a and lower surface 52b of a printing plate 52 for use in this intaglio printing process. When the intaglio printing method is adopted, the printing plate 52 shown in FIGS. 15(a) and 15(b), having recesses 53 (i.e., not reaching the upper surface 52a) on the lower surface 52b, is prepared and those recesses 53 are filled with a resin paste 60. Then, as shown in FIG. 14, the printing plate 52 is placed over the substrate 11 on which the LED chips 12 are arranged and the printing plate 52 and the substrate 11 are brought into close contact with each other. Thereafter, by removing the printing plate 52, the phosphor resin portions 13 can be obtained.

Figure 16:
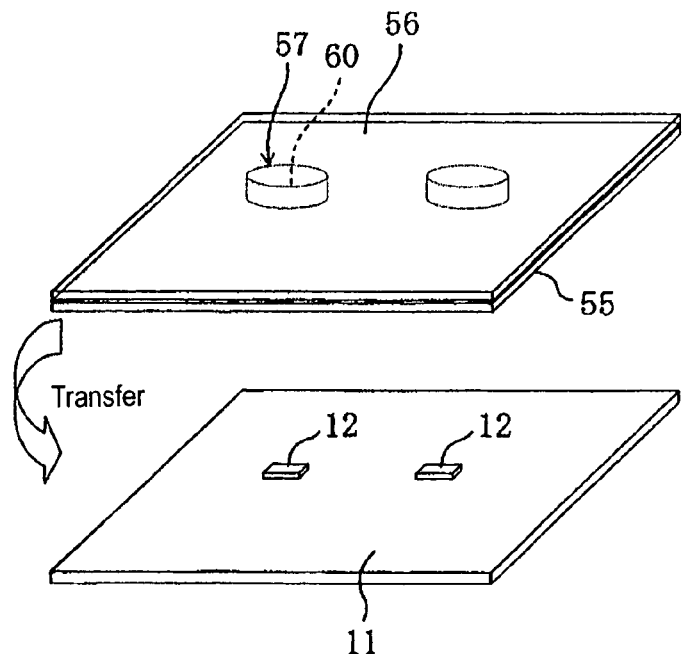
FIG. 16 is a perspective view showing the process step of forming multiple phosphor resin portions 13 by a transfer (planographic) technique.

FIG. 16 shows the process step of forming the phosphor resin portions 13 by the transfer (planographic) method. According to this method, a photosensitive resin film 56 is deposited on a block 55, a plurality of openings 57, corresponding in shape to the phosphor resin portions 13 to be obtained, are provided using a resist, and then those openings 57 are filled with a resin paste 60. Thereafter, the block 55 is pressed against the substrate 11, thereby transferring the resin paste 60 onto the substrate 11. In this manner, the phosphor resin portions 13 are formed so as to cover the LED chips 12.

Figure 17:
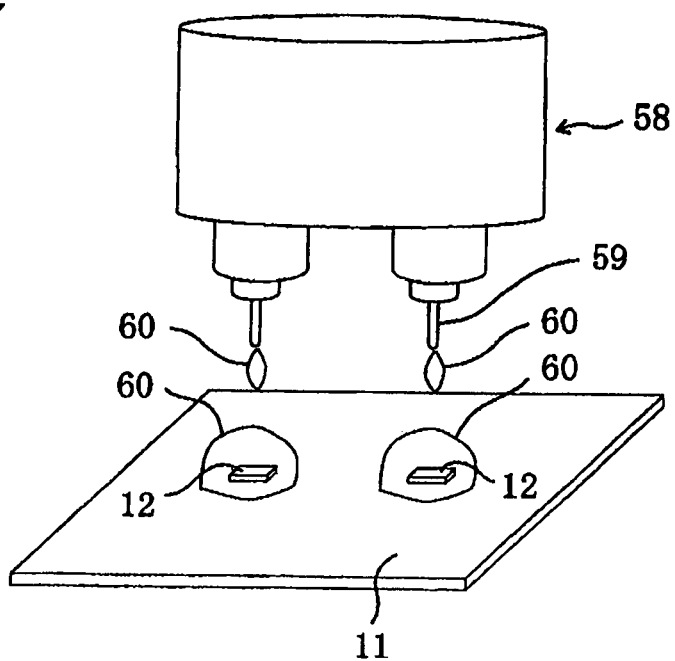
FIG. 17 is a perspective view showing the process step of forming multiple phosphor resin portions 13 by a dispenser method.

FIG. 17 shows the process step of forming the phosphor resin portions 13 by the dispenser method. According to this method, the phosphor resin portions 13 are formed by spraying a predetermined amount of resin paste 60 over the LED chips 12 on the substrate 11 using a dispenser 58 including syringes 59 to spray the resin paste 60. If a greater amount of resin paste 60 is sprayed for the phosphor resin portions 13b than for the phosphor resin portions 13a, then the size of the phosphor resin portions 13b can be increased.

In the LED lamp 100 of this preferred embodiment of the present invention, a plurality of LED chips 12 are arranged two-dimensionally such that the size (e.g., the diameter) of the phosphor resin portions 13b located in the outer region is bigger than that of the phosphor resin portions 13a located in the inner region. Thus, the emission of chromatic rays from the outer LED chips can be minimized, and therefore, the color unevenness can be substantially eliminated. As a result, the present invention contributes to increasing the yield of white LED lamps significantly and popularizing LED lamps as general illumination.

Embodiment 2

Hereinafter, an LED lamp according to a second preferred embodiment of the present invention will be described.

In the first preferred embodiment described above, a means for removing a chromatic ray (a blue ray in this case) that could be emitted from outer LED chips is implemented by changing the sizes of phosphor resin portions 13a and 13b for the inner and outer regions. However, such a chromatic ray may also be removed by a different means.

Figure 18:
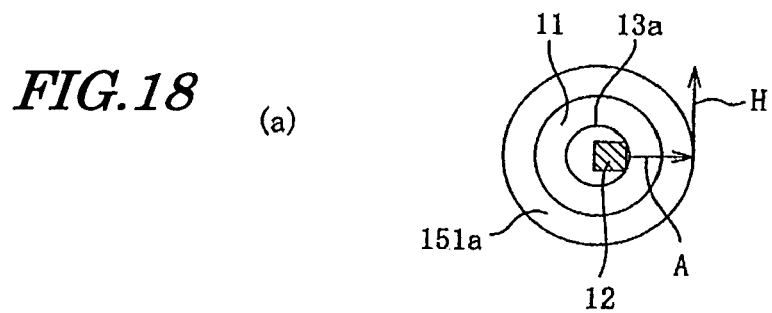
FIGS. 18(a) and 18(b) are top views showing a combination of a phosphor resin portion 13a and a reflective surface 151a, which are located in the inner region, and a combination of a phosphor resin portion 13b and a reflective surface 151a, which are located in the outer region, respectively.
Figure 18:
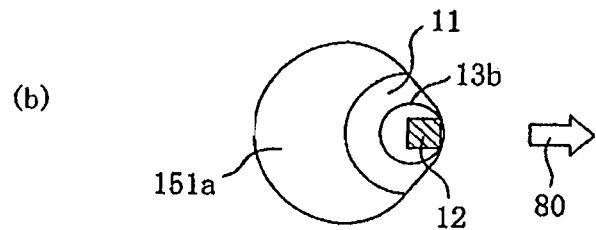

FIGS. 18(a) and 18(b) are top views showing a combination of a phosphor resin portion 13a and a reflective surface 151a, which are located in the inner region, and a combination of a phosphor resin portion 13b and a reflective surface 151a, which are located in the outer region, respectively.

In the arrangement for the inner region shown in FIG. 18(a), the phosphor resin portion 13a and the reflective surface 151a are spaced apart from each other and their distance is substantially constant. Specifically, in the example shown in FIG. 18(a), the phosphor resin portion 13a is located at the center of the reflective surface 151a. On the other hand, in the arrangement for the outer region shown in FIG. 18(b), the outermost part (i.e., that part facing the direction pointed by the arrow 80) of the phosphor resin portion 13b is in contact with the reflective surface 151a. In this example, that contact part of the reflective surface 151a extends substantially perpendicularly.

Figure 19:
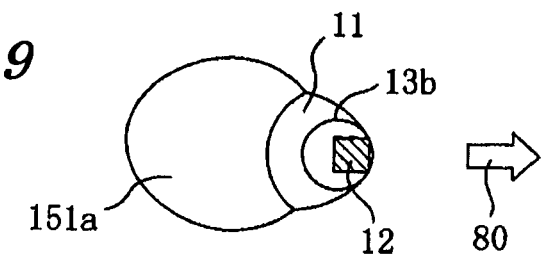
FIG. 19 is a top view showing a combination of a phosphor resin portion 13b and a reflective surface 151a that are located in the outer region.

In the arrangement shown in FIG. 18(a), if the LED chip 12 is exposed on the phosphor resin portion 13a, a chromatic ray A will be emitted from the LED chip 12 but mixed with another light ray after that to produce light H (which is almost white). In the arrangement shown in FIG. 18(b) on the other hand, the outermost part of the phosphor resin portion 13b is in contact with the reflective surface 151a. Accordingly, even if the LED chip 12 is exposed on the phosphor resin portion 13a, no or almost no light ray will be radiated in that direction (i.e., toward the outermost region). To reduce the radiation of the light ray toward the outermost region even more effectively, the circular opening to accommodate the phosphor resin portion 13 may be deformed as shown in FIG. 19 such that a predetermined region of the phosphor resin portion 13 (e.g., at least a quarter of the circle outlining the phosphor resin portion) contacts with the reflective surface 151a.

Figure 20:
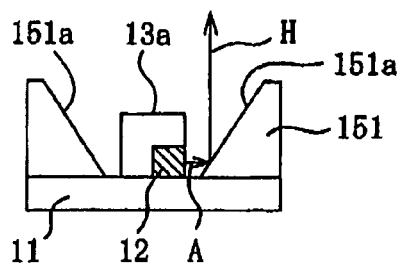
FIGS. 20(a) and 20(b) are side cross-sectional views showing a combination of a phosphor resin portion 13a and a reflective surface 151a, which are located in the inner region, and a combination of a phosphor resin portion 13b and a reflective surface 151a, 151b, which are located in the outer region, respectively.
Figure 20:
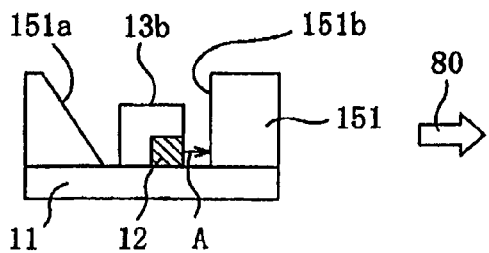

Alternatively, the radiation of the light ray toward the outermost region can also be minimized even by the technique of changing the angles of the reflective surface 151a. FIGS. 20(a) and 20(b) are side cross-sectional views showing a combination of a phosphor resin portion 13a and a reflective surface 151a, which are located in the inner region, and a combination of a phosphor resin portion 13b and a reflective surface 151a, 151b, which are located in the outer region, respectively. The arrangement shown in FIG. 20(a) is similar to that shown in FIG. 18(a) and the reflective surface 151a is angled with respect to a normal to the substrate 11 and may have a parabolic shape, for example. In the arrangement shown in FIG. 20(b) on the other hand, the outermost part (i.e., that part facing the direction pointed by the arrow 80) of the reflective surface 151b extends substantially perpendicularly to the substrate 11, thereby preventing the chromatic ray A from going out of the lamp.

As another alternative, the radiation of the light ray toward the outermost region may also be minimized by changing the surface properties of the reflective surface 151a.

Figure 21:
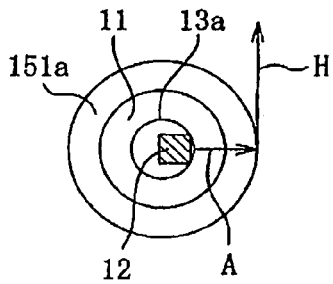
FIGS. 21(a) and 21(b) are top views showing reflective surfaces 151a and 151c in the inner and outer regions, respectively.
Figure 21:
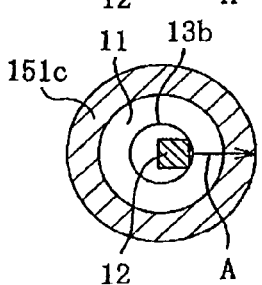

FIGS. 21(a) and 21(b) are top views showing arrangements in the inner and outer regions, respectively. Specifically, the arrangement shown in FIG. 21(a) is similar to those shown in FIGS. 18(a) and 20(a). In the example illustrated in FIG. 21(a), the reflective surface 151a is made of a high-reflectivity material with a specular surface to improve the reflection property of the reflective surface 151a and to reflect uniformly any light ray with a wavelength falling within the visible radiation range. In the arrangement shown in FIG. 21(b) on the other hand, the reflective surface 151c has been subject to a diffusion treatment for minimizing the radiation of the chromatic ray A, a surface treatment for decreasing the reflectance, or a surface treatment for producing the property of absorbing the color of the light ray A (e.g., absorb a short-wave ray or a blue ray). In other words, the reflective surface 151c is designed as at least one of a diffusive surface, a low-reflectance surface, and a surface with the property of absorbing the chromatic ray. Consequently, the light ray A that has been emitted from the LED chip 12 has its directivity weakened and mixed with another ray while leaving the lamp. As a result, the color unevenness problem can be resolved. Optionally, such a surface (e.g., a diffusive surface) may be selectively provided for that part facing the outermost region in the following manner. For example, the reflective surface 151 may be subjected to a roughening treatment. If the reflector 151 is made of aluminum, then the reflectance thereof may be decreased by coloring the reflector 151 in black through an alumite treatment. Or the blue ray may be absorbed if the reflector 151 is colored in yellow. Alternatively, a coloring agent may be added to an epoxy resin, an acrylic resin or any other suitable resin, and then the mixture may be either deposited on the surface of the reflector by an electrodeposition process or applied thereto with a spray, for example. If a black-based coloring agent is selected, the reflectance can be decreased. On the other hand, if the coloring agent selected has some chromatic color, then its opponent color can be absorbed. For example, if the coloring agent is blue, then yellow can be absorbed. If the coloring agent is red, then green can be absorbed. Red is absorbed with a green coloring agent. And blue is absorbed with a yellow agent.

Figure 22:
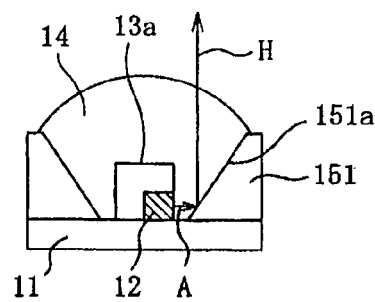
FIGS. 22(a) and 22(b) are side cross-sectional views showing lenses 14 and 14, 14a in the inner and outer regions, respectively.
Figure 22:
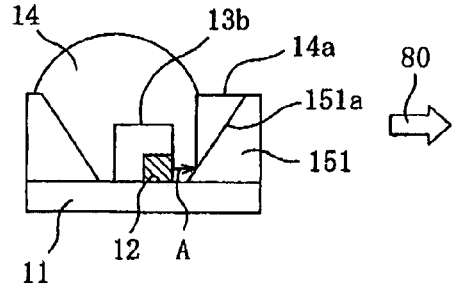

Means for removing the chromatic rays does not have to be one of those reflectors but may also be implemented as a lens 14 that covers the phosphor resin portion 13. FIGS. 22(a) and 22(b) are side cross-sectional views showing arrangements for an inner region and an outer region, respectively. In FIG. 22(a), a convex lens 14 is provided so as to cover the entire surfaces of the phosphor resin portion 13. On the other hand, in FIG. 22(b), a part 14a of a lens 14, facing the outermost region as pointed by the arrow 80, has a substantially planar surface. Then, the light ray A that has been reflected from the reflective surface 151a is focused to a lesser degree, and therefore, color mixture occurs relatively easily and color unevenness can be minimized. If the light ray A needs to be further diffused, that part 14a is preferably subjected to a diffusion treatment.

Figure 23:
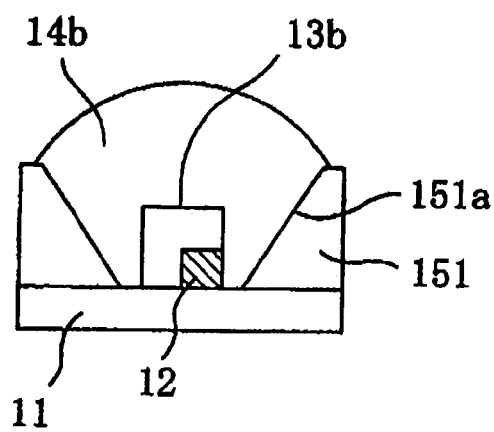
FIG. 23 is a side cross-sectional view showing a lens 14b in the outer region.

As another alternative, instead of changing the shape as in the part 14a, a lens 14b with at least one of diffusion property, low transmittance and the property of absorbing the chromatic color of the light ray A may be used as the lens 14 for the outer region as shown in FIG. 23, thereby minimizing the color unevenness. The lens 14b may be made diffusive with the addition of a photo diffuser or a photo disperser such as alumina or silica. The transmittance of the lens 14b may be decreased by adding the photo diffuser or disperser profusely (e.g., 10% or more although such agent is typically added at approximately 1–3%). And the lens 14b may be given the property of absorbing the chromatic color of the light ray A by adding a pigment in the chromatic color.

Figure 24:
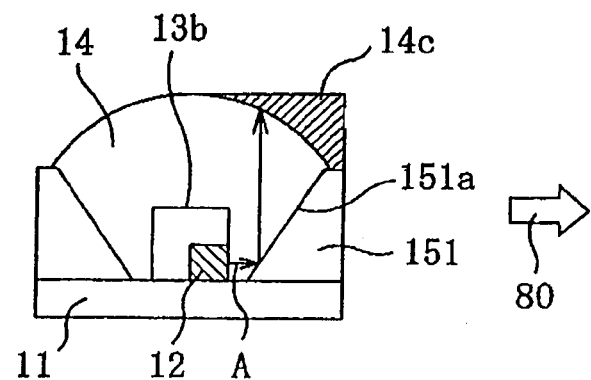
FIG. 24 is a side cross-sectional view showing a mask 14c on a lens 14 in the outer region.

Furthermore, the color unevenness can also be minimized by providing a mask 14c such as an opaque layer on a part of a lens 14 in the outer region, facing the outermost region as pointed by the arrow 80, as shown in FIG. 24. The mask 14c does not have to be the opaque layer but may also be a light diffusing layer, a low-transmittance layer or a layer that absorbs the chromatic color of the light ray A.

Figure 25:
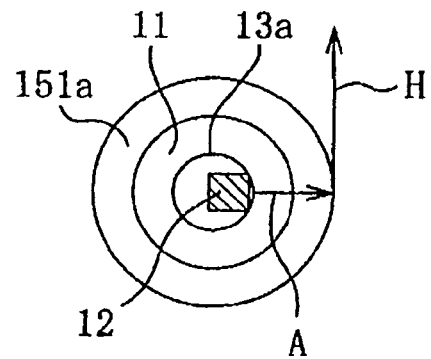
FIGS. 25(a) and 25(b) are top views showing substrates 11 and 11a in the inner and outer regions, respectively.
Figure 26:
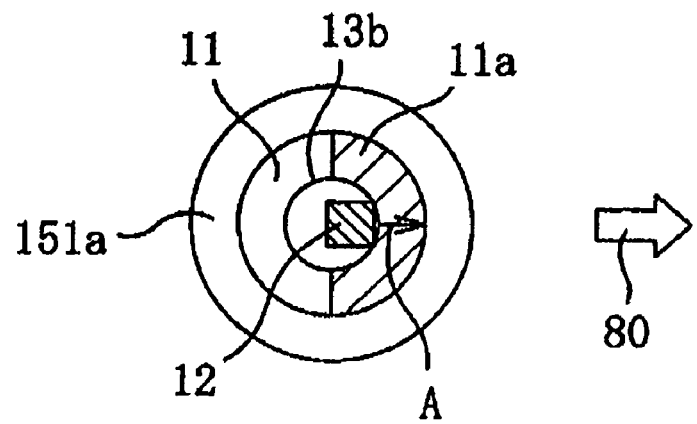
FIG. 26 is a top view showing a substrate 11, 11a in the outer region.

In addition, the means for removing the chromatic ray may also be implemented as the substrate 11. It is possible to use only that means implemented as the substrate 11. However, unlike the reflective surface 151a, the light ray A strikes the substrate 11 indirectly, not directly. For that reason, such means is preferably used just additionally in combination with any of the various means mentioned above. FIGS. 25(a) and 25(b) are top views showing arrangements for the inner region and the outer region, respectively. The arrangement shown in FIG. 25(a) is similar to that shown in FIG. 18(a) and so on. To obtain a more luminous flux, the surface of the substrate 11 is made of a high-reflectivity material and treated so as to reflect uniformly any light ray with a wavelength falling within the visible range. In the substrate 11a shown in FIG. 25(b) on the other hand, its surface is treated so as to have either the property of absorbing the chromatic color of the light ray A (e.g., absorbing a short-wave ray or a blue ray) or a low transmittance. Optionally, as shown in FIG. 26, the substrate 11a with such a property (e.g., the property of absorbing a short-wave ray) may be selectively provided only as a part of the substrate 11 facing the outermost region as pointed by the arrow 80.

Figure 27:
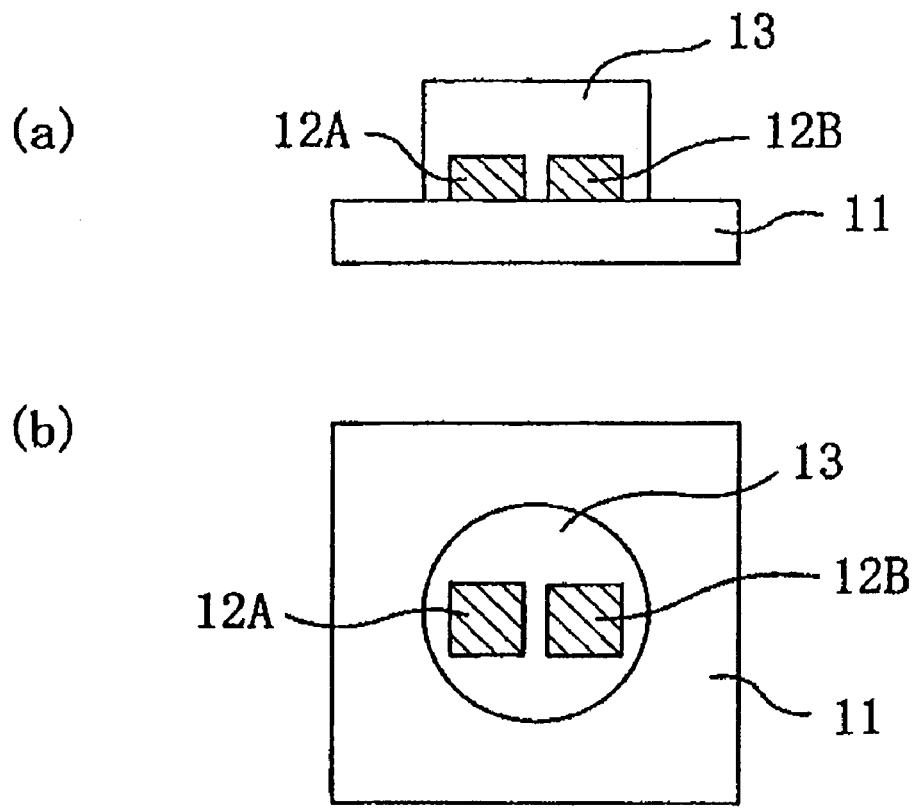
FIGS. 27(a) and 27(b) are respectively a side cross-sectional view and a top view illustrating an arrangement in which two LED chips 12A and 12B are provided within a single phosphor resin portions 13.

In the first and second preferred embodiments described above, one LED chip 12 is provided within one phosphor resin portion 13. However, the present invention is in no way limited to those specific preferred embodiments. If necessary, two or more LED chips 12 may be provided within a single phosphor resin portion 13. FIGS. 27(a) and 27(b) illustrate such an alternative arrangement in which two LED chips 12A and 12B are provided within one phosphor resin portion 13. In this case, the LED chips 12A and 12B may emit either light rays falling within the same wavelength range or light rays falling within mutually different wavelength ranges. For example, the LED chip 12A may be a blue LED chip and the LED chip 12B may be a red LED chip. Then, the two or more LED chips 12 (e.g., 12A and 12B in this example) that are covered with the same phosphor resin portion 13 have a peak wavelength within the range of 380 nm to 780 nm (e.g., a wavelength range of 380 nm to 470 nm, or a wavelength of 460 nm if there is provided only one LED chip 12A of one type) and a peak wavelength of 610 nm to 650 nm (e.g., a wavelength of 620 nm if there is provided only one LED chip 12B of another type). When the blue LED chip 12A and red LED chip 12B are both used, a white LED lamp, of which the color rendering performance is excellent in red colors, can be obtained. More specifically, if a blue LED chip and a yellow phosphor are combined, white can be produced but that white is somewhat short of red components. Consequently, the resultant white LED lamp exhibits insufficient color rendering performance in red colors. However, if the red LED chip 12B is combined with the blue LED chip 12A, then the color rendering performance of the white LED lamp in red colors can be improved. As a result, an LED lamp that can be used as general illumination even more effectively is realized.

The present invention has been described by way of illustrative preferred embodiments. However, the present invention is in no way limited to those specific preferred embodiments but may be modified in various manners.

INDUSTRIAL APPLICABILITY

The present invention provides an LED lamp with its color unevenness minimized, and therefore, can contribute to popularizing LED lamps as general illumination.

What is claimed is:

1. An LED lamp comprising:
   a substrate;
   a cluster of LED chips, which are arranged two-dimensionally on the substrate; and
   a plurality of phosphor resin portions that cover the respective LED chips,
   wherein each said phosphor resin portion includes a phosphor for transforming the emission of its associated LED chip into a light ray having a longer wavelength than that of the emission, and
   wherein a size of the phosphor resin portions, which cover the LED chips located in an outer region of the cluster, is set bigger than that of the other phosphor resin portions, which cover the LED chips located in the remaining non-outer region.

2. The LED lamp of claim 1, wherein if a reference position is defined with respect to the cluster of LED chips, the size of the phosphor resin portions, covering the LED chips that are located most distant from the reference position, is set bigger than that of the phosphor resin portion covering the LED chip at the reference position.

3. The LED lamp of claim 1, wherein each said phosphor resin portion has a substantially cylindrical shape with an almost circular cross section when viewed perpendicularly to the substrate, and
   wherein the diameter of the phosphor resin portions, covering the LED chips located in the outer region, is greater than that of the phosphor resin portions covering the LED chips located in the remaining non-outer region.

4. The LED lamp of claim 1, wherein at least one of the LED chips emits a light ray, of which the peak wavelength falls within the visible radiation range of 380 nm to 780 nm, and wherein the phosphor included in the phosphor resin portion that covers the at least one LED chip produces a light ray, of which the peak wavelength also falls within the visible radiation range of 380 nm to 780 nm but is different from the peak wavelength of the LED chip.

5. The LED lamp of claim 3, wherein the at least one LED chip of the cluster is a blue LED chip that emits a blue light ray, and wherein the phosphor included in the phosphor resin portion covering the blue LED chip is a yellow phosphor that transforms the blue light ray into a yellow light ray.

6. The LED lamp of claim 2, wherein the outer region is a region defined by outermost ones of the LED chips that are arranged two-dimensionally.

7. The LED lamp of claim 2, wherein the phosphor resin portions located in the outer region have substantially equal sizes, and wherein the phosphor resin portions located inside of the outer region also have substantially equal sizes.

8. The LED lamp of claim 1, wherein each of the LED chips is a bare chip LED, and wherein the bare chip LED is flip-chip bonded to the substrate.

9. The LED lamp of claim 1, wherein the substrate has a plurality of openings to store the phosphor resin portions that cover the respective LED chips, and wherein each inner side surface of the substrate, defining its associated opening, functions as a reflective surface for reflecting the emission of its associated LED chip.

10. The LED lamp of claim 9, further comprising a lens that covers each said phosphor resin portion.

11. A method for fabricating an LED lamp, the method comprising the steps of:

arranging a cluster of LED chips on a substrate; and providing a plurality of phosphor resin portions such that the LED chips are covered with the phosphor resin portions, each said phosphor resin portion including a phosphor that transforms the emission of its associated LED chip into a light ray having a longer wavelength than the emission, wherein the step of providing the phosphor resin portions includes the step of setting, if a reference position is defined with respect to the cluster of LED chips, the size of the phosphor resin portions, covering the LED chips that are located most distant from the reference position, bigger than that of the phosphor resin portion covering the LED chip at the reference position.

* * * * *